United States Patent
Lin

(10) Patent No.: US 8,625,275 B2
(45) Date of Patent: Jan. 7, 2014

(54) ELECTRONIC DEVICE WITH HEAT DISSIPATION APPARATUS

(75) Inventor: Tai-Wei Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 133 days.

(21) Appl. No.: 13/338,253

(22) Filed: Dec. 28, 2011

(65) Prior Publication Data

US 2013/0163176 A1    Jun. 27, 2013

(30) Foreign Application Priority Data

Dec. 22, 2011   (TW) .............................. 100148146 A

(51) Int. Cl.
*G06F 1/20* (2006.01)
*H05K 7/20* (2006.01)

(52) U.S. Cl.
USPC ............ 361/679.54; 361/679.32; 361/679.37; 361/704; 361/719; 165/185

(58) Field of Classification Search
USPC ............. 361/679.31–679.33, 679.37, 679.54, 361/704, 715, 719–720; 165/185
See application file for complete search history.

(56) References Cited

U.S. PATENT DOCUMENTS

| | | | | |
|---|---|---|---|---|
| 3,506,185 A * | 4/1970 | Borge | ............................. | 383/10 |
| 4,181,222 A * | 1/1980 | Kepets | .......................... | 206/223 |
| 6,665,184 B2 * | 12/2003 | Akselband | ................... | 361/699 |
| 7,167,366 B2 * | 1/2007 | Cheon | ........................... | 361/699 |
| 7,342,797 B2 * | 3/2008 | Kamath et al. | ................ | 361/721 |
| 7,405,933 B2 * | 7/2008 | Kobayashi et al. | ........... | 361/695 |
| 7,768,785 B2 * | 8/2010 | Ni et al. | ........................ | 361/715 |
| 8,004,846 B2 * | 8/2011 | Okada et al. | .................. | 361/721 |
| 2009/0180718 A1 * | 7/2009 | Walker et al. | ................. | 383/202 |
| 2009/0244852 A1 * | 10/2009 | Okada et al. | .................. | 361/721 |

FOREIGN PATENT DOCUMENTS

JP    2002163885 A   *  6/2002  ............. G11B 33/14

* cited by examiner

*Primary Examiner* — Robert J Hoffberg
(74) *Attorney, Agent, or Firm* — Altis Law Group, Inc.

(57) ABSTRACT

A heat dissipation apparatus includes a shaped and resilient connecting plate, and a first heat-dissipating plate and a second heat-dissipating plate clamping down on a storage device to dissipate heat.

11 Claims, 5 Drawing Sheets

ELECTRONIC DEVICE WITH HEAT DISSIPATION APPARATUS

BACKGROUND

1. Technical Field

The present disclosure relates to electronic devices and, particularly, to an electronic device with a heat dissipation apparatus.

2. Description of Related Art

Electronic components, such as memory cards, and solid state disks (SSDs), generate a large amount of heat during operation. It is necessary to cool the SSDs to maintain safe operating conditions and assure the proper and reliable functioning of the SSDs. A fan may generate a cooling airflow, but as the loads increase and the operating speeds of the devices using the electronic components increase, heat dissipation using only airflow may be insufficient for the amount of heat generated.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
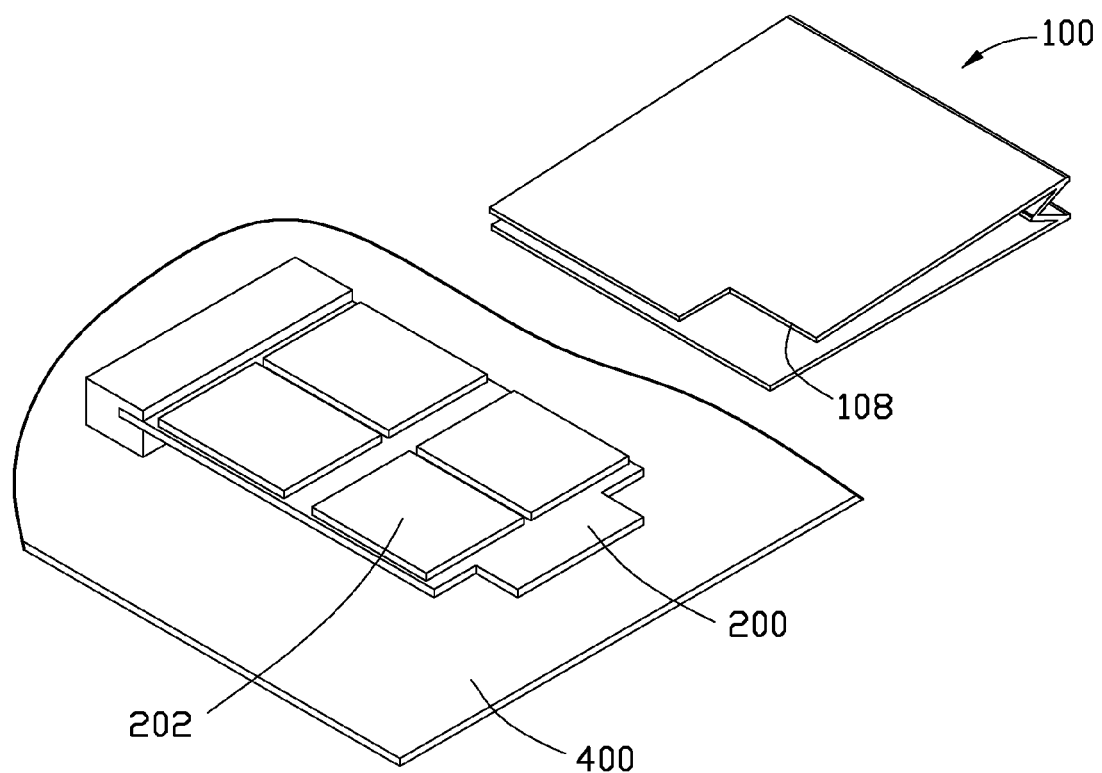
FIG. 1 is an exploded, isometric view of a first exemplary embodiment of an electronic device, wherein the electronic device includes a heat dissipation apparatus.

Referring to FIG. 1, a first embodiment of an electronic device includes a motherboard 400, a storage device 200 positioned on the motherboard 400, and a heat dissipation apparatus 100.

The storage device 200 includes a plurality of components 202 mounted on both sides of the storage device 200. The storage device 200 is parallel to and spaced away from the motherboard 400. In the embodiment, the storage device 200 is a solid state disk (SSD).

Figure 2:
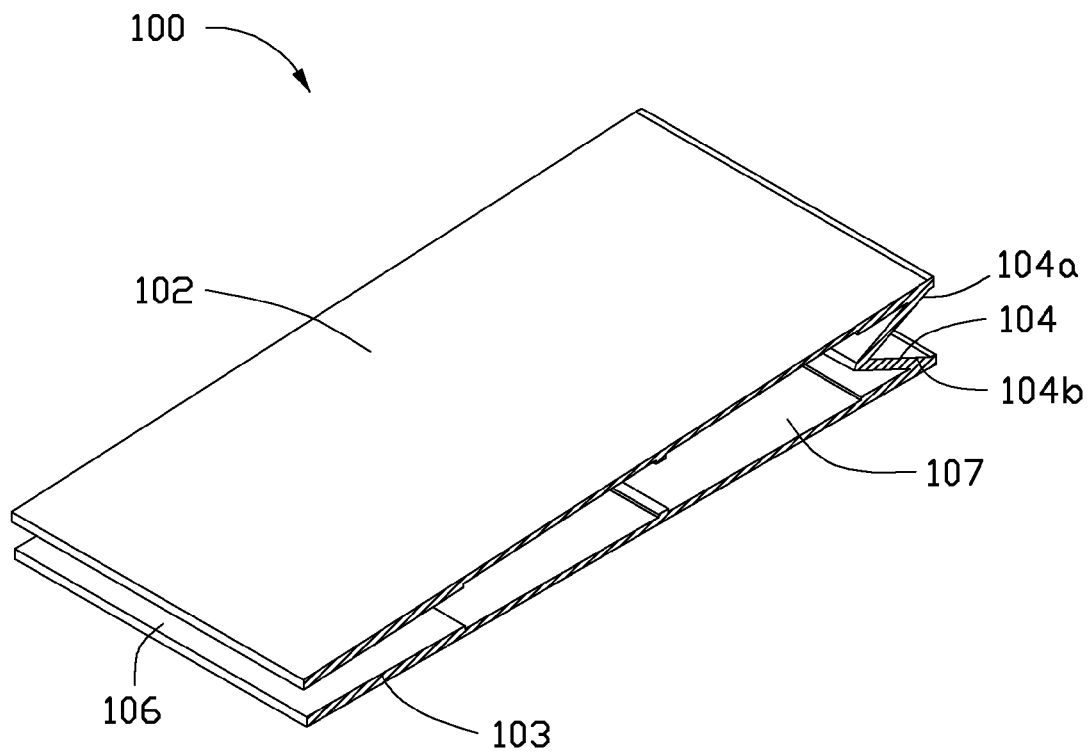
FIG. 2 is an enlarged and cutaway view of the heat dissipation apparatus of FIG. 1.

Referring to FIG. 2, the heat dissipation apparatus 100 includes a resilient connecting plate 104 with a V-shaped cross-section and comprising a first distal side 104a and a second distal side 104b opposite to the first distal side 104a, and a first heat-dissipating plate 102 and a second heat-dissipating plate 103 slantingly extending from the first and second distal sides 104a and 104b toward each other. The structure of the plate 104 connecting with the first and second heat-dissipating plates 102 and 103 resembles M-shaped in cross section. The connecting plate 104, and the first and second heat-dissipating plates 102 and 103 cooperatively bound a receiving space 106. The inner surfaces of the first and second heat-dissipating plates 102 and 103 each define a plurality of receiving slots 107. A distal end of the first heat-dissipating plate 102 opposite to the connecting plate 104 defines a cutout 108, for access and manipulation purposes. In the embodiment, the heat dissipation apparatus 100 may be made of a resilient and heat-dissipating material, such as steel or aluminum, and is configured to resiliently endure some deformation.

Figure 3:
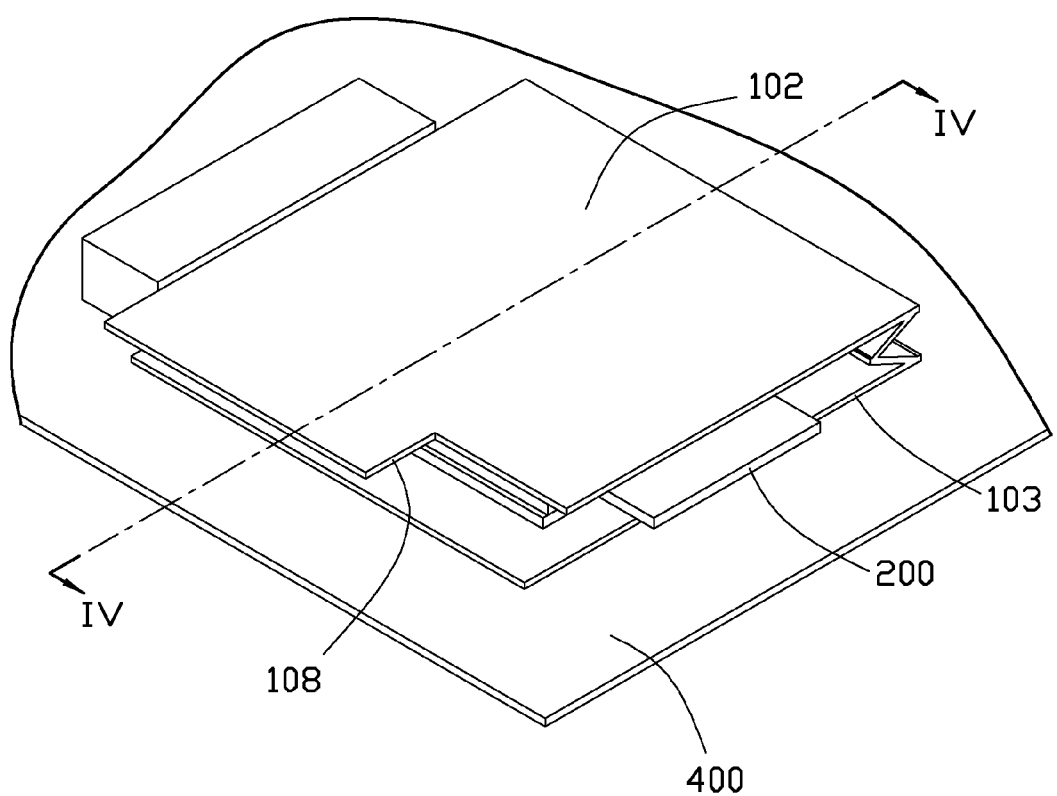
FIG. 3 is an assembled, isometric view of the heat dissipation apparatus of FIG. 1.
Figure 4:
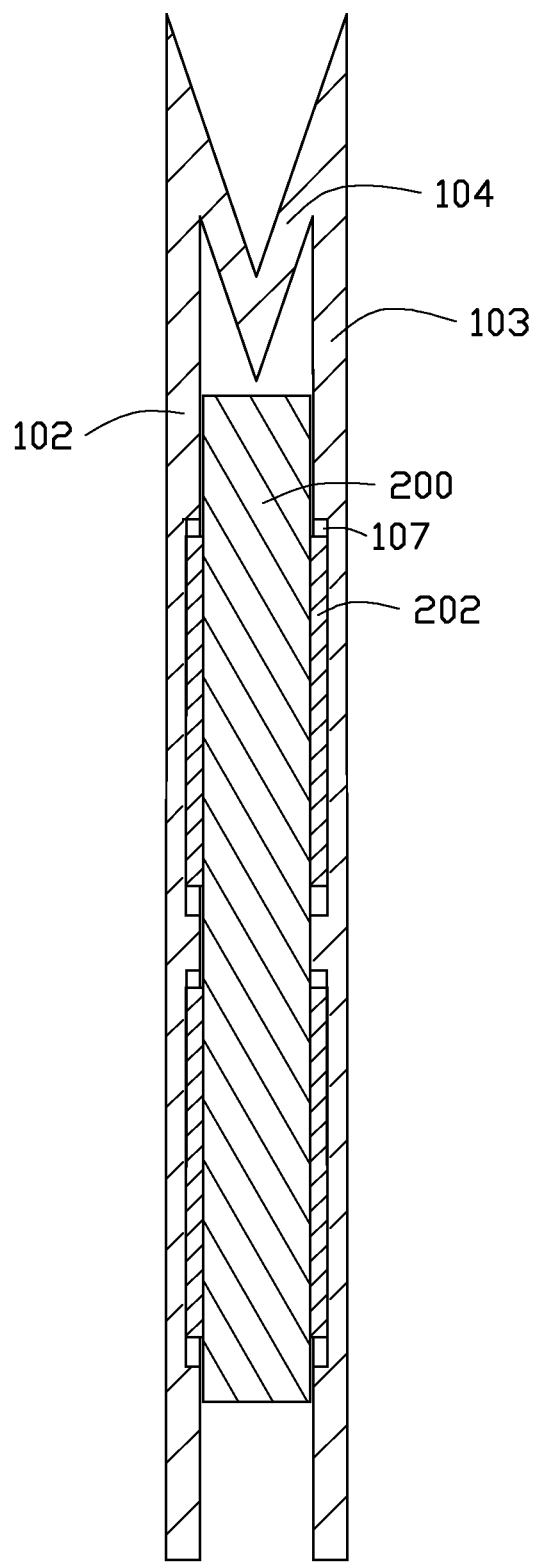
FIG. 4 is a sectional view of the heat dissipation apparatus in FIG. 3, taken along the line of IV-IV.

Referring to FIGS. 3-4, in assembly of the heat dissipation apparatus 100 to the storage device 200, the first and second heat-dissipating plates 102 and 103 can be pulled away from each other, by finger pressure through the cutout 108. The second heat-dissipating plate 103 is below the storage device 200. Therefore, the storage device 200 fits into the receiving space 106. After the components 202 are aligned with the receiving slots 107, the first and second heat-dissipating plates 102 and 103 are released. The first and second heat-dissipating plates 102 and 103 self-restore to clamp between them the storage device 200. The components 202 are received in the receiving slots 107 to prevent the heat dissipation apparatus 100 from disengaging from the storage device 200, and, being electrically isolated as necessary, make contact with each of the components 202 to facilitate the transfer of heat into the heat dissipation apparatus 100.

In use, any amount of heat generated by the components 202 is transferred to the heat dissipation apparatus 100 to provide a large surface area for the immediate and rapid dissipation of heat.

Figure 5:
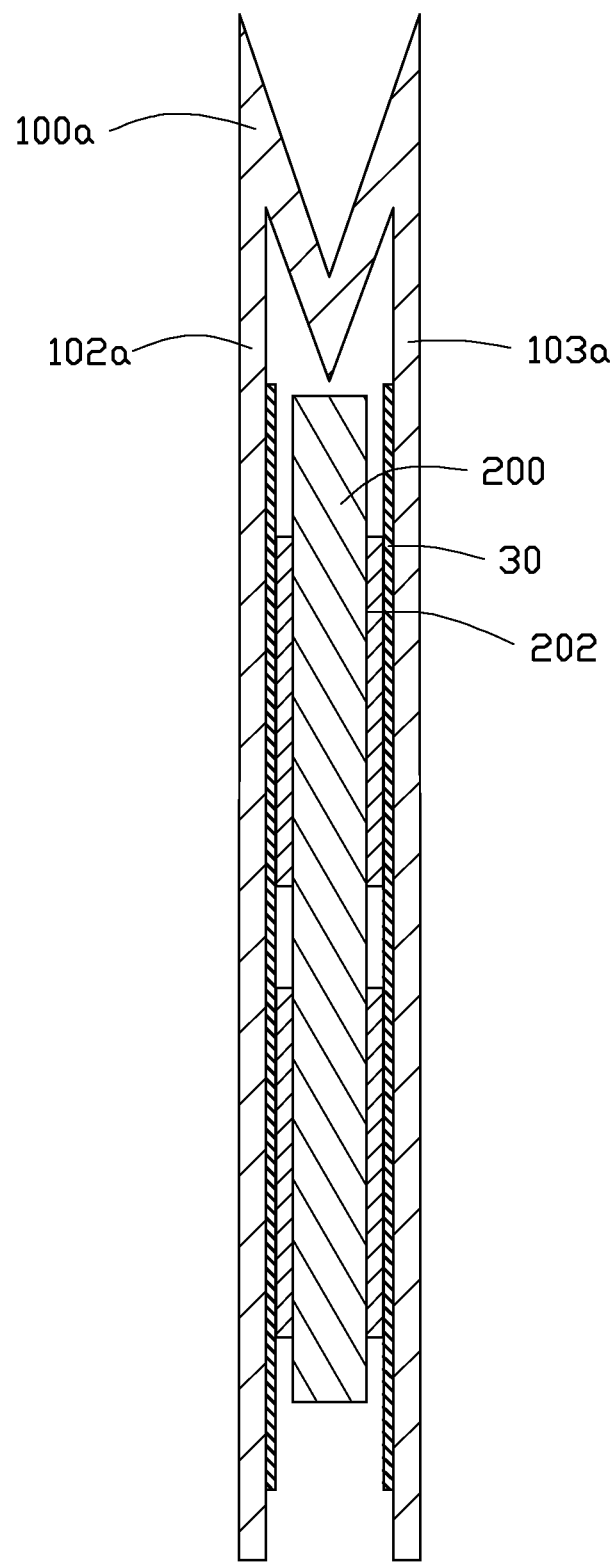
FIG. 5 is a sectional view of a second exemplary embodiment of an electronic device.

Referring to FIG. 5, a second embodiment of an electronic device is substantially similar to the first embodiment of the electronic device, except that a heat dissipation apparatus 100a includes a first heat-dissipating plate 102a, a second heat-dissipating plate 103a, and a flexible guiding plate 30 mounted on each inner surface of the first and second heat-dissipating plates 102a and 103a. The guiding plates 30 can be deformed to clamp different types of storage devices of different thicknesses. Any amount of heat generated is transferred to the heat dissipation apparatus 100a through the guiding plates 30.

While the disclosure describes examples and embodiments, it is to be understood that the disclosure is not limited thereto. On the contrary, the disclosure is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation apparatus for cooling a storage device, comprising: a resilient connecting plate with a V-shaped cross-section and comprising a first distal side and a second distal side; a first heat-dissipating plate slantingly extending from the first distal side of the connecting plate; and a second heat-dissipating plate slantingly extending from the second distal side of the connecting plate toward the first heat-dissipating plate, to clamp the storage device together with the first heat-dissipating plate; wherein the connecting plate, the first heat-dissipating plate, and second heat-dissipating plate are each a metallic heat-dissipating material, are each only a single layer thick, and resiliently endure deformations when the storage device is sandwiched between the first and second heat-dissipating plates.

2. The heat dissipation apparatus of claim 1, wherein inner surfaces of the first and second heat-dissipating plates each define a plurality of receiving slots for receiving a plurality of components of the storage device.

3. The heat dissipation apparatus of claim 1, further comprising two flexible guiding plates mounted on inner surfaces of the first and second heat-dissipating plates, to clamp the storage device.

4. The heat dissipation apparatus of claim 1, wherein the heat dissipation apparatus is made of steel or aluminum.

5. The heat dissipation apparatus of claim 1, wherein a distal end of the first heat-dissipating plate opposite to the connecting plate defines a cutout, for access and manipulation purposes.

6. An electronic device comprising: a motherboard; a storage device positioned on the motherboard, and comprising a plurality of components mounted to two opposite sides of the storage device; and a heat dissipation apparatus comprising a V-shaped resilient connecting plate with two opposite distal sides, and a first heat-dissipating plate and a second heat-dissipating plate slantingly extending from the two opposite distal sides of the connecting plate toward each other, to clamp the storage device; wherein the connecting plate, the first heat-dissipating plate, and second heat-dissipating plate are each a metallic heat-dissipating material, are each only a single layer thick, and resiliently endure deformations when the storage device is sandwiched between the first and second heat-dissipating plates.

7. The electronic device of claim 6, wherein inner surfaces of the first and second heat-dissipating plates each define a plurality of receiving slots for receiving the corresponding components of the storage device.

8. The electronic device of claim 6, wherein the heat dissipation apparatus further comprises two flexible guiding plates mounted on inner sides of the first and second heat-dissipating plates, to clamp the storage device.

9. The electronic device of claim 6, wherein the heat dissipation apparatus is made of steel or aluminum.

10. The electronic device of claim 6, wherein the storage device is a solid state disk.

11. The electronic device of claim 6, wherein a distal end of the first heat-dissipating plate opposite to the connecting plate defines a cutout, for access and manipulation purposes.

* * * * *